(12) United States Patent
Nakata (10) Patent No.: US 12,143,026 B2
(45) Date of Patent: Nov. 12, 2024

(54) POWER CONVERSION DEVICE

(71) Applicant: Mitsubishi Electric Corporation, Tokyo (JP)

(72) Inventor: Hayato Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 163 days.

(21) Appl. No.: 17/696,476

(22) Filed: Mar. 16, 2022

(65) Prior Publication Data

US 2022/0407431 A1   Dec. 22, 2022

(30) Foreign Application Priority Data

Jun. 18, 2021   (JP) .................................. 2021-101292

(51) Int. Cl.
*H05K 7/20* (2006.01)
*H02M 7/00* (2006.01)

(52) U.S. Cl.
CPC ............ *H02M 7/003* (2013.01); *H05K 7/209* (2013.01)

(58) Field of Classification Search
None
See application file for complete search history.

(56) References Cited

U.S. PATENT DOCUMENTS

| | | | |
|---|---|---|---|
| 10,932,397 B2* | 2/2021 | Yamahira | H01L 25/18 |
| 2014/0092663 A1* | 4/2014 | Shimizu | H05K 7/20254 |
| | | | 363/141 |
| 2015/0305188 A1 | 10/2015 | Maeda et al. | |
| 2020/0093039 A1* | 3/2020 | Tokuyama | H05K 7/14329 |
| 2021/0110972 A1* | 4/2021 | Li | H01G 4/236 |

FOREIGN PATENT DOCUMENTS

| | | |
|---|---|---|
| JP | 2014-090659 A | 5/2014 |
| JP | 2014-128084 A | 7/2014 |
| JP | 2017-139886 A | 8/2017 |

OTHER PUBLICATIONS

Notice of Reason for Refusal dated Jul. 5, 2022 from the Japanese Patent Office in JP Application No. 2021-101292.

* cited by examiner

*Primary Examiner* — Courtney L Smith
(74) *Attorney, Agent, or Firm* — Sughrue Mion, PLLC (57) ABSTRACT

This power conversion device includes: a semiconductor power module including a module busbar; a capacitor module including a capacitor element, a capacitor case formed in a bottomed tubular shape and storing the capacitor element with sealing resin interposed therebetween and a capacitor busbar having one end electrically connected to the capacitor element and another end extending outward from the capacitor case and electrically connected to the module busbar; and a power conversion device case formed in bottomed tubular shape and storing the semiconductor power module and the capacitor module. An outer surface of a bottom wall of the capacitor case and an inner surface of a bottom wall of the power conversion device case are thermally connected to each other. The capacitor module has a heat dissipation member located toward an opening side of the capacitor case relative to the capacitor element and thermally connected to the sealing resin.

10 Claims, 9 Drawing Sheets

POWER CONVERSION DEVICE

BACKGROUND OF THE INVENTION

1. Field of the Invention

The present disclosure relates to a power conversion device.

2. Description of the Background Art

In an electric vehicle using a motor as a drive source as in an electric automobile or a hybrid vehicle, a plurality of power conversion devices are mounted. Examples of power conversion devices include a charger for converting commercial AC power to DC power and charging a high-voltage battery, a DC/DC converter for converting DC power of a high-voltage battery to voltage (e.g., 12 V) for an auxiliary-device battery, and an inverter for converting DC power from a battery to AC power for a motor.

As an example of such power conversion devices, disclosed is a power conversion device including a semiconductor power module having a switch element for performing power conversion, a cooler for cooling the semiconductor power module, and a capacitor module having a capacitor element for smoothing DC voltage supplied from an external DC power supply (see, for example. Patent Document 1). Since ripple current flows through the capacitor element, the capacitor element consumes power and generates heat. In addition, the capacitor element is connected to the semiconductor power module via a busbar, and therefore, when the temperature of the semiconductor power module increases, heat transfers from the semiconductor power module to the capacitor element via the busbar, and the temperature of the capacitor element is also increased by the transferred heat. In particular, in a high-output-density power conversion device, heat transfer to the busbar connecting the semiconductor power module and the capacitor element, and heat generation due to Joule heat of the busbar, are increased. When the temperature of the busbar is significantly increased, heat transfers to the capacitor element and the temperature of the capacitor element increases. Temperature increase in the capacitor element shortens the life of the capacitor element, thus posing a problem of taking measures for temperature increase in the capacitor element.

In a structure disclosed in Patent Document 1, a power conversion device includes: a capacitor having a capacitor element/an open-side electrode and a bottom-wall-side electrode which are a pair of electrodes formed at both end surfaces of the capacitor element, capacitor busbars respectively connected to these electrodes, and a capacitor case storing the capacitor element therein; a semiconductor power module connected to the capacitor busbars; and a cooler. The open-side electrode which is one of the electrodes is connected to a cooler-side terminal of the semiconductor power module, and the bottom-wall-side electrode which is the other electrode is thermally connected via a sealing material to a bottom wall of the capacitor case located on the bottom-wall side of the capacitor element.

Patent Document 1: Japanese Laid-Open Patent Publication No. 2017-139886

In Patent Document 1, from the bottom-wall-side electrode side, heat generated in the capacitor element can be dissipated to the capacitor case via the sealing material. However, heat dissipation from the open-side electrode side is made through a terminal of the semiconductor power module and the capacitor busbar having high thermal resistance because the heat dissipation path is long. Thus, there is a problem that heat of the capacitor element cannot be sufficiently dissipated from the open-side electrode side. In addition, as the heat generation amount of the semiconductor power module increases due to the high output density of the power conversion device, heat that the capacitor element receives from the semiconductor power module increases, thus causing a problem that the capacitor element is deteriorated due to the heat reception.

SUMMARY OF THE INVENTION

Accordingly, an object of the present disclosure is to provide a power conversion device that allows heat of a capacitor element to be dissipated efficiently, thus suppressing deterioration of the capacitor element.

A power conversion device according to the present disclosure includes: a semiconductor power module including a module body portion and a module busbar protruding from the module body portion; a capacitor module including a capacitor element, a capacitor case formed in a bottomed tubular shape and storing the capacitor element with sealing resin interposed therebetween, and a capacitor busbar having one end electrically connected to the capacitor element and another end extending outward from the capacitor case and electrically connected to the module busbar; and a power conversion device case formed in a bottomed tubular shape and storing the semiconductor power module and the capacitor module. An outer surface of a bottom wall of the capacitor case and an inner surface of a bottom wall of the power conversion device case are thermally connected to each other. The capacitor module has a heat dissipation member located toward an opening side of the capacitor case relative to the capacitor element and thermally connected to the sealing resin. The capacitor element is located between the heat dissipation member and the bottom wall of the power conversion device case.

In the power conversion device according to the present disclosure, the outer surface of the bottom wall of the capacitor case formed in a bottomed tubular shape and storing the capacitor element with the sealing resin interposed therebetween, and the inner surface of the bottom wall of the power conversion device case, are thermally connected to each other, the capacitor module including the capacitor element and the capacitor case has the heat dissipation member located toward the opening side of the capacitor case relative to the capacitor element and thermally connected to the sealing resin, and the capacitor element is located between the heat dissipation member and the bottom wall of the power conversion device case. Thus, heat of the capacitor element can be efficiently dissipated from both of the side toward the heat dissipation member and the side toward the bottom wall of the power conversion device case, of the capacitor element. Since heat of the capacitor element can be efficiently dissipated from both sides of the capacitor element, the temperature distribution inside the capacitor element can be uniformed and thus deterioration of the capacitor element can be suppressed.

DETAILED DESCRIPTION OF THE PREFERRED EMBODIMENTS OF THE INVENTION

Hereinafter, a power conversion device according to embodiments of the present disclosure will be described with reference to the drawings. In the drawings, the same or corresponding members and parts are denoted by the same reference characters, to give description.

First Embodiment

Figure 1:
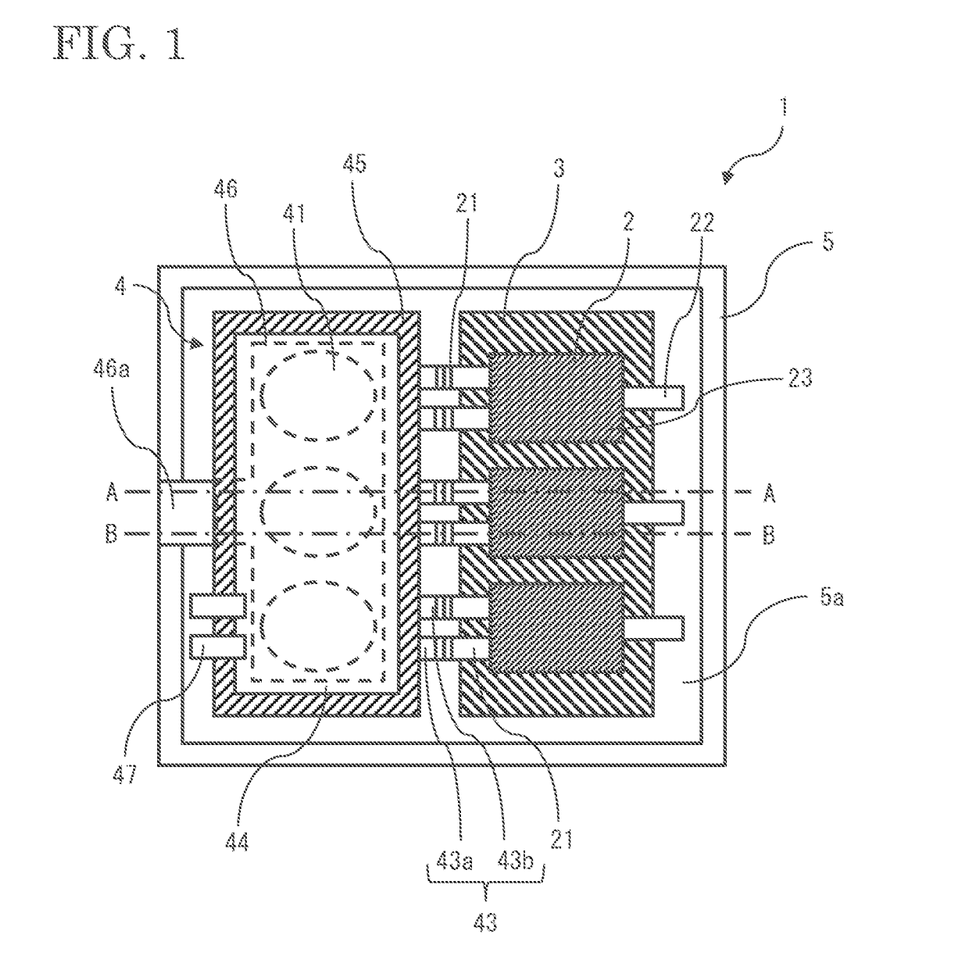
FIG. 1 is a plan view schematically showing a power conversion device according to the first embodiment of the present disclosure.
Figure 2:
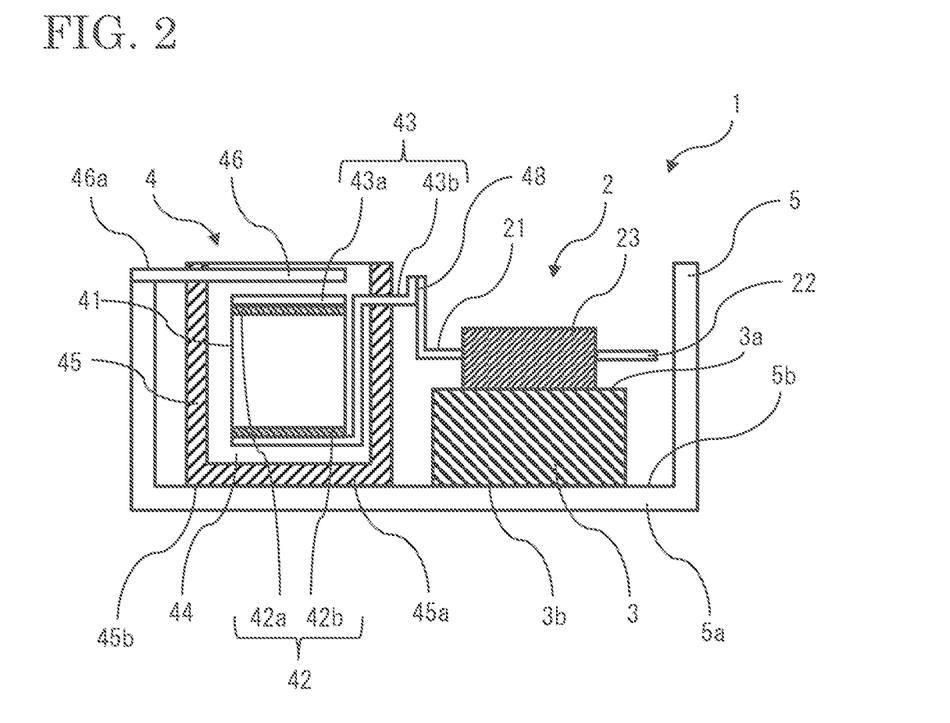
FIG. 2 is a sectional view of the power conversion device taken at an A-A cross-section position in FIG. 1.
Figure 3:
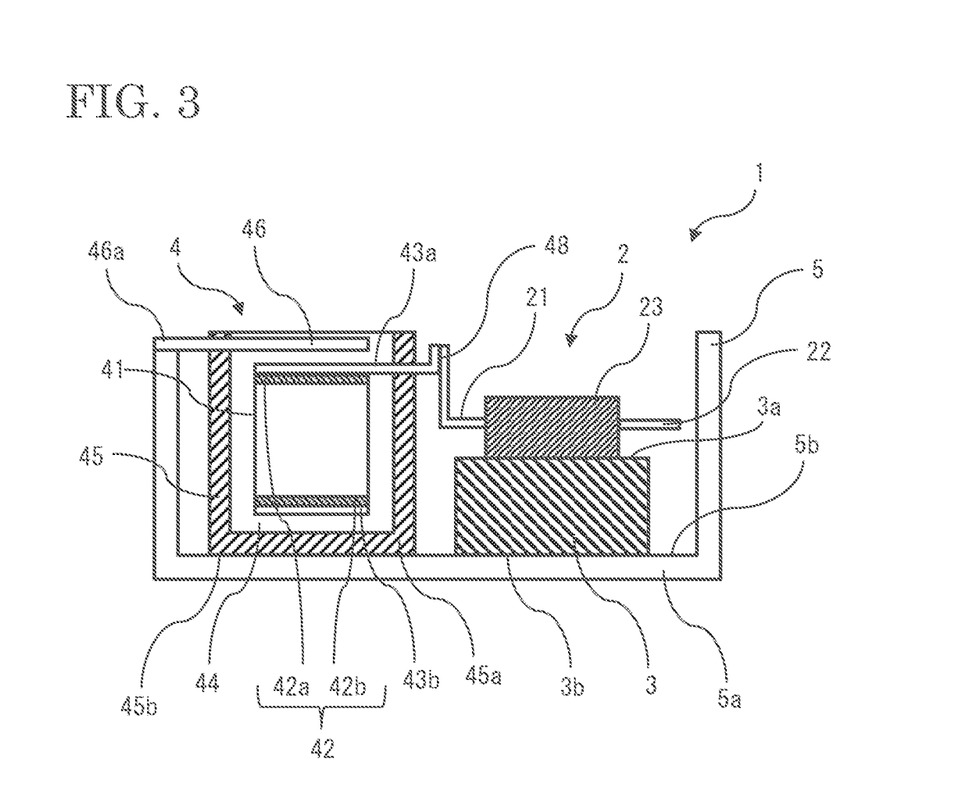
FIG. 3 is a sectional view of the power conversion device taken at a B-B cross-section position in FIG. 1.
Figure 4:
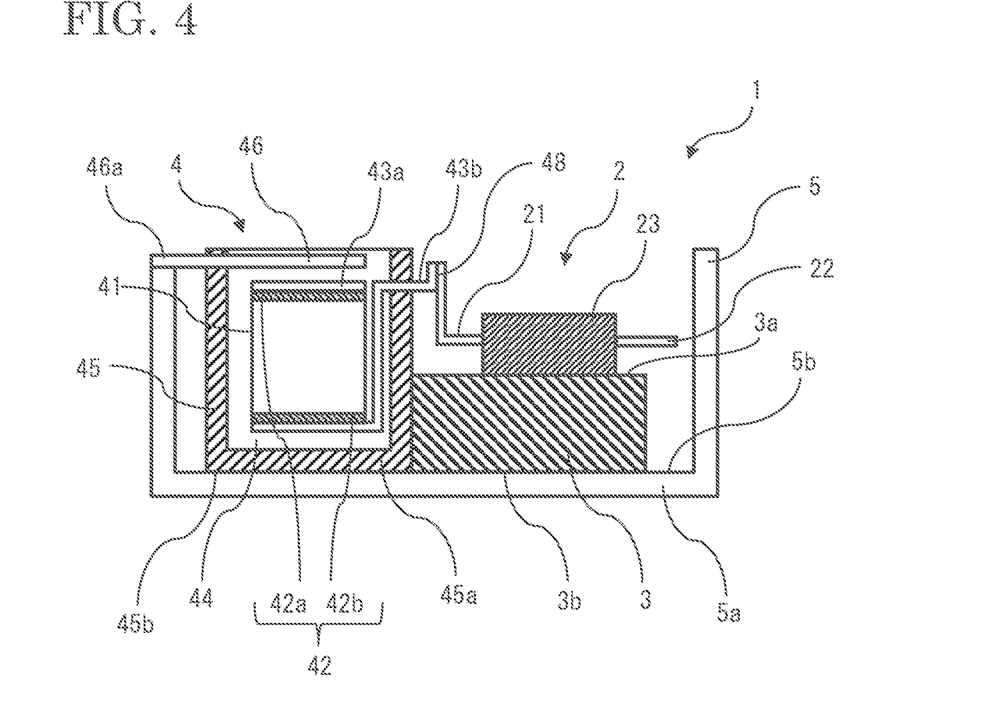
FIG. 4 is a sectional, view schematically showing another power conversion device according to the first embodiment.
Figure 5:
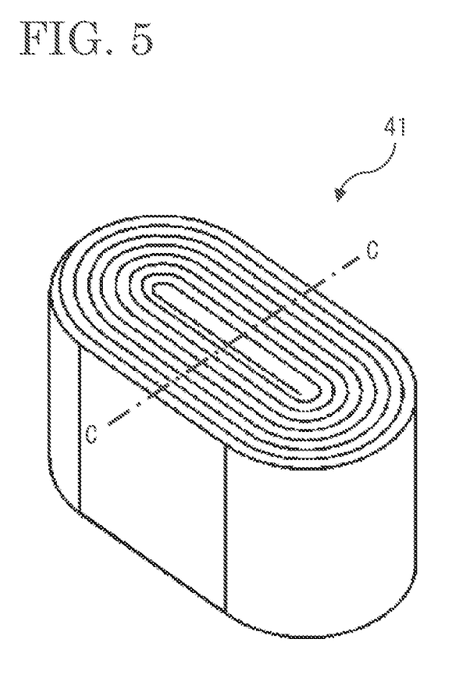
FIG. 5 is a perspective view schematically showing a capacitor element of the power conversion device according to the first embodiment.
Figure 6:
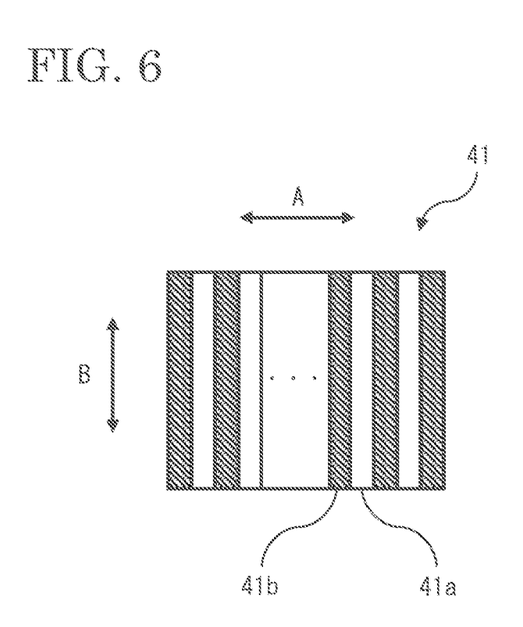
FIG. 6 is a sectional view of the capacitor element taken at a C-C cross-section position in FIG. 5.
Figure 7:
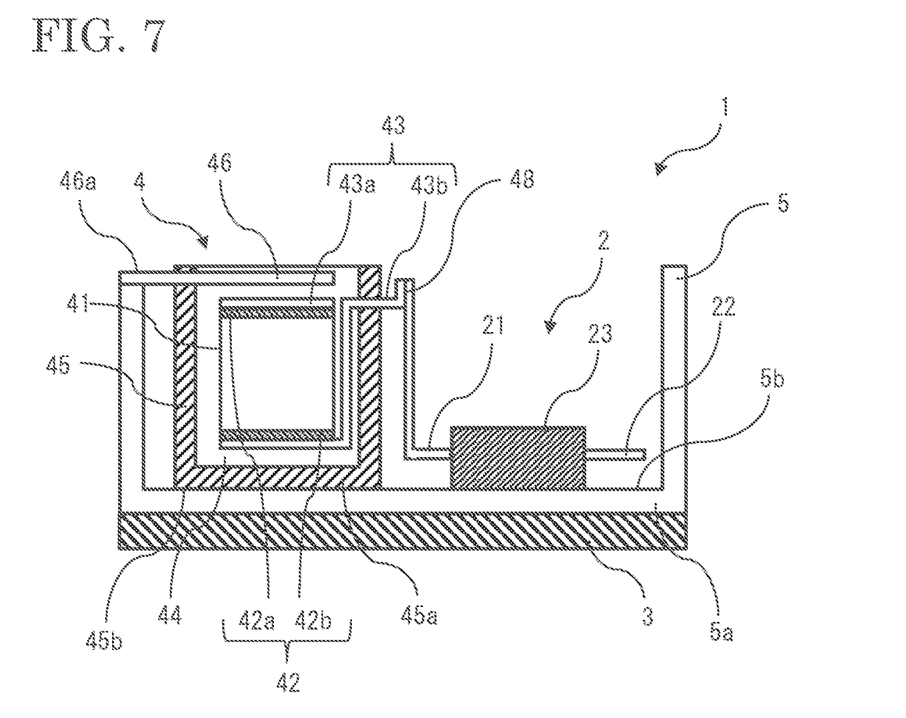
FIG. 7 is a sectional view schematically showing another power conversion device according to the first embodiment.

FIG. 1 is a plan view schematically showing a power conversion device 1 according to the first embodiment, with internal wiring of a capacitor module 4 not shown. FIG. 2 is a sectional view of the power conversion device 1 taken at an A-A cross-section position in FIG. 1. FIG. 3 is a sectional view of the power conversion device 1 taken at a B-B cross-section position in FIG. I. FIG. 4 is a sectional view schematically showing another power conversion device 1 according to the first embodiment, taken at a position equivalent to the A-A cross-section position in FIG. 1. FIG. 5 is a perspective view schematically showing a capacitor element 41 of the power conversion device 1. FIG. 6 is a sectional, view of the capacitor element 4 2 taken at a C-C cross-section position in FIG. 5. FIG. 7 is a sectional view schematically showing another power conversion device 1 according to the first embodiment, taken at a position equivalent to the A-A cross-section position in FIG. 1. The power conversion device 1 is a device for converting input current from DC to AC or from AC to DC, or converting input voltage to different voltage.

As shown in FIG. 1, the power conversion device 1 includes semiconductor power, modules 2, a cooler 3, the capacitor module 4, and a power conversion device case 5. The power conversion device case 3 is formed in a bottomed tubular shape, and stores the semiconductor power modules 2, the capacitor module 4, and the cooler 3. The power conversion device case 5 is made from metal such as aluminum. The power conversion device I in the present embodiment is a device in which DC power inputted from power-supply-side terminals 47 of the capacitor module 4 and smoothed by the capacitor module 4 is converted by the semiconductor power modules 2 and the resultant power is outputted from output terminals 22. In the present embodiment, the power conversion device 1 outputs three-phase AC power, and three semiconductor power modules 2 corresponding to the respective phases are provided. A DC power supply provided outside the power conversion device 1 and connected to the power-supply-side terminals 47 is not shown in FIG. 1. The power conversion device 1 is not limited to the above configuration, and may be a device that converts input current from AC to DC. In addition, the power conversion device 1 may not necessarily have the cooler 3. As shown in FIG. 7, a configuration may be made such that the power conversion device 1 does not have the cooler 3, the cooler 3 is provided on the outer side of a bottom wall 5a of the power conversion device case 5, and the power conversion device case 5 does not store the cooler 3. However, storing the cooler 3 in the power conversion device case 5 leads to size reduction of the power conversion device 1, whereby productivity of the power conversion device 1 can be improved.

<Semiconductor Power Module 2>

The semiconductor power module 2 includes a module body portion 23 storing a plurality of semiconductor elements (not shown), a module busbar 21, and the output terminal 22. The module busbar 21 and the output terminal 22 are provided so as to protrude outward from the module body portion 23. The module body portion 23 part shown in FIG. 1 is a case or a protection member such as resin surrounding the semiconductor elements, for example. The module busbar 21 and the output terminal 22 are made of copper which is small in electrical resistivity and excellent in electric conductivity, for example. The module busbar 21 is electrically connected to a capacitor busbar 43 of the capacitor module 4.

<Cooler 3>

The cooler 3 is formed in a rectangular parallelepiped shape. As shown in FIG. 2, the cooler 3 is thermally connected to the semiconductor power, module 2 at a cooling surface 3a which is a top surface, and cools the semiconductor power module 2. The cooler 3 is thermally connected to the power conversion device case 5 at a cooling surface 3b which is a bottom surface, and cools the power conversion device case 5 and the capacitor module 4. The cooler 3 has therein a coolant path (not shown) through which a coolant flows. As the coolant, for example, water or an ethylene glycol solution is used. The cooling surfaces 3a, 3b are cooled by the coolant. The cooler 3 is not limited to the configuration having the coolant path, and a configuration having a heat dissipation fin to dissipate heat to outside may be adopted. The cooler 3 is manufactured by die casting from aluminum, for example. If the power conversion device 1 has the cooler 3 thermally connected directly to the semiconductor power module 2, the semiconductor power module 2 can be efficiently cooled.

<Capacitor Module 4>

The capacitor module 4 includes the capacitor elements 41 each having a pair of positive or negative capacitor electrodes 42 at both ends, a capacitor case 45 formed in a bottomed tubular shape and storing the capacitor elements 41 with sealing resin 44 interposed therebetween, and the capacitor busbars 43 each having one end electrically connected to the capacitor element 41. Each capacitor busbar 43 has another end extending outward from the capacitor case 45 and electrically connected to the module busbar 21. The capacitor busbar 43 and the module busbar 21 are connected by welding at a welding portion 43 via which both busbars contact with each other. A connection method for the capacitor busbar 43 and the module busbar 21 is not limited to welding, and they may be connected by screwing.

The capacitor case 45 is manufactured by die casting from aluminum, for example. A bottom wall 45a of the capacitor case 45 is formed in a rectangular shape, for example. An outer surface 45b of the bottom wall 45a of the capacitor case 45 and an inner surface 5b of the bottom wall 5a of the power conversion device case 5 are thermally connected to each other, so that the capacitor case 45 is thermally connected to the cooler 3 via the power conversion device case 5. Therefore, heat of the capacitor element 41 can be dissipated from the bottom wall 45a side of the capacitor case 45. The sealing resin 44 is a member made of epoxy resin or the like and having insulating property.

In the present embodiment, the capacitor case 45 stores three capacitor elements 41. In FIG. 1, the outer shape of each capacitor element 41 is indicated by a broken line. The three capacitor elements 41 are respectively connected to the three semiconductor power modules 2. The number of the capacitor elements 41 is not limited to three. A plurality of semiconductor power modules 2 may be connected to one capacitor element 41, or a plurality of capacitor elements 41 and one semiconductor power module 2 may be connected to each other.

For connecting the capacitor module 4 and the semiconductor power modules 2 with a low wiring inductance therebetween, the capacitor module 4 and the semiconductor power modules 2 are located closely to each other. Since the capacitor module 4 and the semiconductor power modules 2 are located closely to each other and the capacitor module 4 and the semiconductor power modules 2 are connected to each other with a low wiring inductance, generation of extra loss in the busbars connecting the capacitor module 4 and the semiconductor power modules 2 can be suppressed. Since generation of loss is suppressed, heat generation due to Joule heat of the busbars is suppressed, whereby the capacitor elements 41 can be protected from temperature increase.

Each capacitor element 41 smooths DC power. As the capacitor busbars 43, a first capacitor busbar and a second capacitor busbar are provided. The capacitor element 41 has a first electrode connected to the first capacitor busbar, and a second electrode connected to the second capacitor busbar. One of the first electrode and the second electrode is located on a side of the capacitor element 41 toward the bottom wall 5a of the power conversion device case 5, and the other of the first electrode and the second electrode is located on a side of the capacitor element 41 toward a heat dissipation plate 46. In the present embodiment, the one of the first electrode and the second electrode is a bottom-wall-side electrode 42b, and the other of the first electrode and the second electrode is an open-side electrode 42a. A second capacitor busbar 43b is connected to the bottom-wall-side electrode 42b, and a first capacitor busbar 43a is connected to the open-side electrode 42a. Although, in the present embodiment, the capacitor electrodes 42 are provided on a side of the capacitor element 41 toward the bottom wall 5a of the power conversion device case 5, and a side of the capacitor element 41 toward the heat dissipation plate 46, the places thereof are not limited thereto. The capacitor electrodes 42 may be provided at a side part, of the capacitor element 41 located between the side toward the bottom wall 5a of the power conversion device case 5 and the side toward the heat dissipation plate 46, of the capacitor element 41. In addition, either the open-side electrode 42a or the bottom-wall-side electrode 42b may be a positive electrode.

The capacitor module 4 has the heat dissipation plate 46 which is a heat dissipation member located toward the opening side of the capacitor case 45 relative to the capacitor element 41 and thermally connected to the sealing resin 44. The capacitor element 41 is located between the heat dissipation plate 46 and the bottom wall 5a of the power conversion device case 5. Although, in the present embodiment, the heat dissipation member is formed in a plate shape, the heat dissipation member is not limited to a plate shape and may be formed in a block shape. The heat dissipation plate 46 has an inner part located inside the capacitor case 45, and an outer extending part 46a extending from the inner part outward of the capacitor case 45. In FIG. 1, the inner part of the heat dissipation plate 46 is indicated by a broken line. As shown in FIG. 2, one surface of the heat dissipation plate 46 is opposed to the open-side electrode 42a of the capacitor element 41 via the sealing resin 44, and the other surface of the heat dissipation plate 46 is located on the opening side of the capacitor case 45. The heat dissipation plate 46 is made from metal such as aluminum having a higher thermal conductivity than the sealing resin 44. Since the heat dissipation plate 46 is thermally connected to the capacitor element 41 via the sealing resin 44, heat of the capacitor element 41 can be efficiently dissipated from the other surface of the heat dissipation plate 46. If the heat dissipation plate 46 has the outer extending part 46a, heat of the capacitor element 41 can be more efficiently dissipated from the outer extending part 46a. Since the heat dissipation plate 46 is provided to the capacitor case 45, a work for newly providing the heat dissipation plate 46 to the power conversion device 1 is not needed, and thus productivity of the power conversion device 1 can be improved.

Since the capacitor element 41 is located between the heat dissipation plate 46 and the bottom wall 5a of the power conversion device case 5, heat of the capacitor element 41 can be efficiently dissipated from both of the side toward the heat dissipation plate 46 and the side toward the bottom wall 5a of the power conversion device case 5, of the capacitor element 41. Since heat of the capacitor element 41 can be efficiently dissipated from both sides of the capacitor element 41, the temperature distribution inside the capacitor element 41 can be uniformed and thus deterioration of the capacitor element 41 can be suppressed.

In addition, when the capacitor electrodes 42 are provided on the side toward the heat dissipation plate 46 and the side toward the bottom wall 5a of the power conversion device case 5, of the capacitor element 41, heat generated in the capacitor busbars 43 connected to the capacitor electrodes 42 and heat that, the capacitor busbar 43 receives from the semiconductor power module 2 and the module busbars 21 connected to the capacitor busbars 43 can be efficiently dissipated, together with heat of the capacitor element 41, from both sides of the bottom wall 45a of the capacitor case 45 and the heat dissipation plate 46.

The capacitor busbar 43 connected to the other of the first electrode and the second electrode, and the heat dissipation plate 46, are arranged in parallel. In the present embodiment, as shown in FIG. 3, the first capacitor busbar 43a and the heat dissipation plate 46 are arranged in parallel. With this configuration, eddy current occurs in the heat dissipation plate 46 with respect to current flowing through the first capacitor busbar 43a connected to the open-side electrode 42a, whereby inductance in the first capacitor busbar 43a can be reduced. Arrangement of the capacitor busbar 43 connected to the other of the first electrode and the second electrode, and the heat dissipation plate 46, is not limited to parallel arrangement. If the capacitor electrode 42 is provided at a side part of the capacitor element 41, the capacitor busbar 43 is also provided at the side part of the capacitor element 41.

As shown in FIG. 2, the outer extending part 46a of the heat dissipation plate 46 is thermally connected to a peripheral wall of the power conversion device case 5. The outer extending part 46a is connected to the peripheral wall of the power conversion device case 5 by a screw (not shown), for example. By thermally connecting the outer extending part 46a and the power conversion device case 5, heat of the capacitor element 41 can be efficiently dissipated to the power conversion device case 5. In addition, the capacitor module 4 can be firmly connected to the power conversion device case 5, whereby vibration resistance of the capacitor module 4 can be improved. In addition, since the heat dissipation plate 46 is located on the opening side of the capacitor module 4 and is thermally connected to the peripheral wall of the power conversion device case 5, it is possible to reduce the influence of heat generated in the capacitor module 4 on another component placed on the opening side of the capacitor module 4, e.g., a control board for the semiconductor power module 2. In addition, if the capacitor element 41 has a ground and the ground of the capacitor element 41 is connected to the heat dissipation plate 46, reinforcement of the ground and elimination of electromagnetic noise can be efficiently achieved. Without limitation to the configuration in which the outer extending part 45a and the power conversion device case 5 are thermally connected, a heat dissipation portion such as a heat dissipation fin may be provided to the outer extending part 46a so as to efficiently dissipate heat of the capacitor module 4 to outside. A connection method for the outer extending part 46a and the power conversion device case 5 is not limited to screwing, and they may be connected by fitting.

<Capacitor Element 41>

The structure of the capacitor element 41 will be described. As shown in FIG. 5, the capacitor element 41 is a film capacitor of a wound type having a stacked structure. For showing the stacked structure, the capacitor element 41 with the capacitor electrodes 42 not formed is shown in FIG. 5. As shown in FIG. 6, the capacitor element 41 has metal films 41a stacked with dielectric materials 41b interposed therebetween, the dielectric materials 41b being members having insulating property. The thermal conductivity of the metal films 41a is higher than the thermal conductivity of the dielectric materials 41b. Therefore, the thermal conductivity of the capacitor element 41 is higher in a direction (arrow B in FIG. 6) perpendicular to the stacking direction of the metal films 41a than in the stacking direction (arrow A in FIG. 6) of the metal films 41a. The bottom wall 45a of the capacitor case 45 is located on one side in the direction perpendicular to the stacking direction of the metal films 41a, and the heat dissipation plate 46 is located on the other side in the direction perpendicular to the stacking direction of the metal films 41a. Since the thermal conductivity is higher in the direction perpendicular to the stacking direction of the metal films 41a, if the direction in which the thermal conductivity of the capacitor element 41 is higher is aligned with the direction of a heat dissipation path where the bottom wall 45a of the capacitor case 45 and the heat dissipation plate 46 are located, heat of the capacitor element 41 can be more efficiently dissipated toward the bottom wall 45a of the capacitor case 45 and the heat dissipation plate 46.

In the present embodiment, the configuration in which the capacitor case 45 is thermally connected to the cooler 3 via the power conversion device case 5 has been shown. However, a configuration for thermally connecting the capacitor case 45 and the cooler 3 is not limited thereto. For example, as shown in FIG. 4, a side surface of the capacitor case 45 and a side surface of the cooler 3 may be thermally connected by directly contacting with each other. When the capacitor case 45 and the cooler 3 directly contact with each other, heat of the capacitor element 41 can be more efficiently dissipated.

As described above, in the power conversion device 1 according to the first embodiment, the outer surface 45b of the bottom wall 45a of the capacitor case 45 formed in a bottomed tubular shape and storing the capacitor element 41 with the sealing resin 44 interposed therebetween, and the inner surface 5b of the bottom wall 5a of the power conversion device case 5, are thermally connected to each other, the capacitor module 4 including the capacitor element 41 and the capacitor case 45 has the heat dissipation plate 46 located toward the opening side of the capacitor case 45 relative to the capacitor element 41 and thermally connected to the sealing resin 44, and the capacitor element 41 is located between the heat dissipation plate 46 and the bottom wall 5a of the power conversion device case 5. Thus, heat of the capacitor element 41 can be efficiently dissipated from both of the side toward the heat dissipation plate 46 and the side toward the bottom wall 5a of the power conversion device case 5, of the capacitor element 41. Since heat of the capacitor element 41 can be efficiently dissipated from both sides of the capacitor element 41, the temperature distribution inside the capacitor element 41 can be uniformed and thus deterioration of the capacitor element 41 can be suppressed.

One of the first electrode and the second electrode of the capacitor element 41 may be located on the side of the capacitor element 41 toward the bottom wall 5a of the power conversion device case 5, and the other of the first electrode and the second electrode of the capacitor element 41 may be located on the side of the capacitor element 41 toward the heat dissipation plate 46. Thus, together with heat of the capacitor element 41, heat generated in the capacitor busbar 43 connected to the capacitor electrode 42 and heat that the capacitor busbar 43 receives from the semiconductor power module 2 and the module busbar 21 connected to the capacitor busbar 43 can be efficiently dissipated from both sides of the bottom wall 45a of the capacitor case 45 and the heat dissipation plate 46.

The heat dissipation plate 46 may have the inner part located inside the capacitor case 45 and the outer extending part 46a extending from the inner part outward of the capacitor case 45. Thus, heat of the capacitor element 41 can be more efficiently dissipated from the outer extending part 46a. In addition, the outer extending part 46a of the heat dissipation plate 46 may be thermally connected to the peripheral wall of the power conversion device case 5. Thus, heat of the capacitor element 41 can be more efficiently dissipated to the power conversion device case 5.

The first capacitor busbar 43a connected to the open-side electrode 42a which is the other of the first electrode and the second electrode, and the heat dissipation plate 46, may be arranged in parallel. Thus, with respect to current flowing through the first capacitor busbar 43a connected to the open-side electrode 42a, eddy current occurs in the heat dissipation plate 46, whereby inductance in the first capacitor busbar 43a can be reduced.

The bottom wall 45a of the capacitor case 45 may be located on one side in the direction perpendicular to the stacking direction of the metal films 41a of the capacitor element 41, and the heat dissipation plate 46 may be located on the other side in the direction perpendicular to the stacking direction of the metal films 41a. Thus, the thermal conductivity becomes higher in the direction perpendicular to the stacking direction of the metal films 41a. Therefore, if the direction in which the thermal conductivity of the capacitor element 41 is higher is aligned with the direction of a heat dissipation path where the bottom wall 45a of the capacitor case 45 and the heat dissipation plate 46 are located, heat of the capacitor element 41 can be more efficiently dissipated.

The cooler 3 thermally connected to the semiconductor power module 2 may be provided, and the power conversion device case 5 may store the cooler 3 and be thermally connected to the cooler 3. Thus, the power conversion device 1 can be downsized and the semiconductor power module 2 can be efficiently cooled. The capacitor case 45 may be thermally connected to the cooler 3. Thus, heat of the capacitor element 41 stored in the capacitor case 45 can be more efficiently dissipated to the cooler 3.

Second Embodiment

Figure 8:
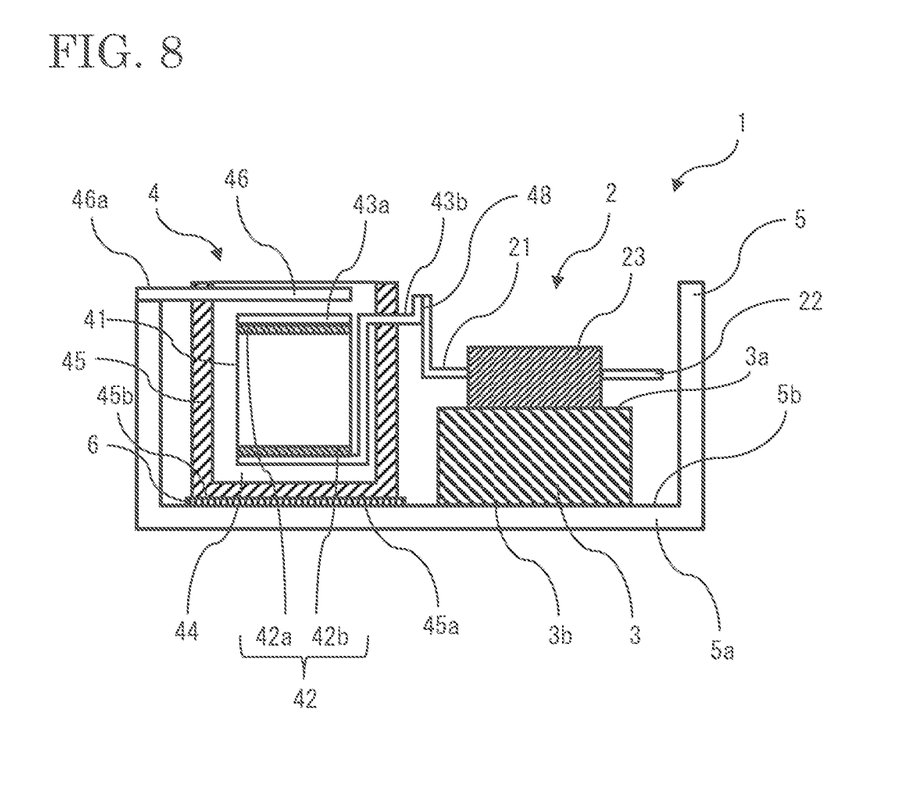
FIG. 8 is a sectional view schematically showing a power conversion device according to the second embodiment of the present disclosure.

A power conversion device I according to the second embodiment will be described. FIG. 8 is a sectional view schematically showing the power conversion device 1 according to the second embodiment, taken at a position equivalent to the A-A cross-section position in FIG. 1. The power conversion device 1 according to the second embodiment is configured such that a heat dissipation material 6 is provided in addition to the power conversion device 1 shown in the first embodiment.

The capacitor case 45 and the power conversion device case 5 are thermally connected to each other via the heat dissipation material 6. The heat dissipation material 6 is, for example, grease for heat dissipation. The heat dissipation material 6 is not limited to grease for heat dissipation, and may be a heat dissipation sheet or a heat dissipation compound. In addition, without limitation to a position between the capacitor case 45 and the power conversion device case 5, the heat dissipation material 6 may be provided between the cooler 3 and the power conversion device case 5.

As described above, in the power conversion device 1 according to the second embodiment, the capacitor case 45 and the power conversion device case 5 are thermally connected to each other via the heat dissipation material 6. Thus, heat, of the capacitor element 41 stored in the capacitor case 45 can be efficiently dissipated to the power conversion device case 5 from the bottom wall 45a side of the capacitor case 45.

Third Embodiment

Figure 9:
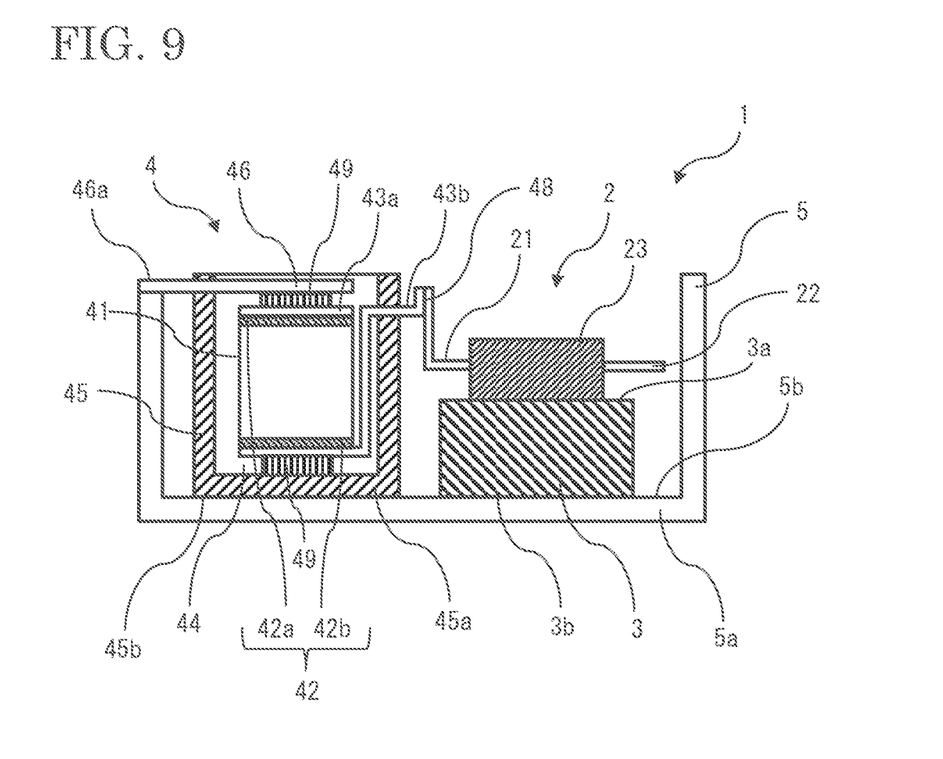
FIG. 9 is a sectional view schematically showing a power conversion device according to the third embodiment of the present disclosure.

A power conversion device 1 according to the third embodiment will be described. FIG. 9 is a sectional view schematically showing the power conversion device 1 according to the third embodiment, taken at a position equivalent to the A-A cross-section position in FIG. 2. The power conversion device 1 according to the third embodiment is configured such that insulating members 49 are provided in addition to the power conversion device 1 shown in the first embodiment.

The insulating member 49 having a higher thermal conductivity than the sealing resin 44 is provided between the capacitor busbar 43 connected to the other of the first electrode and the second electrode of the capacitor element 41, and the heat dissipation plate 46. In addition, the insulating member 49 having a higher thermal conductivity than the sealing resin 44 is provided between the capacitor busbar 43 connected to the one of the first electrode and the second electrode of the capacitor element 41, and the bottom wall 45a of the capacitor case 45. In the present, embodiment, the one of the first electrode and the second electrode is the bottom-wall-side electrode 42b, and the other of the first electrode and the second electrode is the open-side electrode 42a. The second capacitor busbar 43b is connected to the bottom-wall-side electrode 42b, and the first capacitor busbar 43a is connected to the open-side electrode 42a. The insulating member 49 is, for example, an insulating sheet, but is not limited thereto. Although, in the present embodiment, the insulating members 49 are provided on both sides of the capacitor element 41, the insulating member 49 may be provided on only a side where heat dissipation of the capacitor element 41 is desired to be promoted.

As described above, in the power conversion device 1 according to the third embodiment, the insulating member 49 having a higher thermal conductivity than the sealing resin 44 is provided between the first capacitor busbar 43a connected to the open-side electrode 42a which is the other of the first electrode and the second electrode, and the heat dissipation plate 46. Thus, heat of the capacitor element 41 can be more efficiently dissipated from the other surface of the heat dissipation plate 46 and the outer extending part 46a of the heat dissipation plate 46. In addition, the insulating member 49 having a higher thermal conductivity than the sealing resin 44 may be provided between the second capacitor busbar 43b connected to the bottom-wall-side electrode 42b which is the one of the first electrode and the second electrode, and the bottom wall 45a of the capacitor case 45. Thus, heat of the capacitor element 41 can be more efficiently dissipated from the bottom wall 45a side of the capacitor case 45.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 power conversion device
2 semiconductor power module
21 module busbar
22 output terminal
23 module body portion
3 cooler
3a, 3b cooling surface
4 capacitor module
41 capacitor element
41a metal film
41b dielectric material
42 capacitor electrode
42a open-side electrode
42b bottom-wall-side electrode
43 capacitor busbar
43a first capacitor busbar
43b second capacitor busbar
44 sealing resin
45 capacitor case 45a bottom wall
45b outer surface
46 heat dissipation plate
46a outer extending part
47 power-supply-side terminal
48 welding portion
49 insulating member
5 power conversion device case
5a bottom wall
5b inner surface
6 heat dissipation material.

What is claimed is:

1. A power conversion device comprising:
a semiconductor power module including a module body portion storing a semiconductor element, and a module busbar protruding from the module body portion;
a capacitor module including a capacitor element, a capacitor case formed in a bottomed tubular shape and storing the capacitor element with sealing resin interposed therebetween, and a capacitor busbar having one end electrically connected to the capacitor element and another end extending outward from the capacitor case and electrically connected to the module busbar; and
a power conversion device case formed in a bottomed tubular shape and storing the semiconductor power module and the capacitor module, wherein
an outer surface of a bottom wall of the capacitor case and an inner surface of a bottom wall of the power conversion device case are thermally connected to each other,
the capacitor module has a heat dissipation member located toward an opening side of the capacitor case relative to the capacitor element and thermally connected to the sealing resin,
the capacitor element is located between the heat dissipation member and the bottom wall of the power conversion device case,
as the capacitor busbar, a first capacitor busbar and a second capacitor busbar are provided,
the capacitor element has a first electrode connected to the first capacitor busbar and a second electrode connected to the second capacitor busbar,
one of the first electrode and the second electrode is located on a side of the capacitor element toward the bottom wall of the power conversion device case, and
another of the first electrode and the second electrode is located on a side of the capacitor element toward the heat dissipation member.

2. The power conversion device according to claim 1, wherein
the heat dissipation member has an inner part located inside the capacitor case and an outer extending part extending from the inner part outward of the capacitor case.

3. The power conversion device according to claim 2, wherein
the outer extending part is thermally connected to a peripheral wall of the power conversion device case.

4. The power conversion device according to claim 1, wherein
the capacitor busbar connected to the other of the first electrode and the second electrode, and the heat dissipation member, are arranged in parallel.

5. The power conversion device according to claim 1, wherein
an insulating member having a higher thermal conductivity than the sealing resin is provided between the capacitor busbar connected to the other of the first electrode and the second electrode, and the heat dissipation member.

6. The power conversion device according to claim 1, wherein
an insulating member having a higher thermal conductivity than the sealing resin is provided between the capacitor busbar connected to the one of the first electrode and the second electrode, and the bottom wall of the capacitor case.

7. The power conversion device according to claim 1, wherein
the capacitor element has metal films stacked with a dielectric material interposed therebetween,
the bottom wall of the capacitor case is located on one side in a direction perpendicular to a stacking direction of the metal films, and
the heat dissipation member is located on another side in the direction perpendicular to the stacking direction of the metal films.

8. The power conversion device according to claim 1, further comprising a cooler thermally connected to the semiconductor power module, wherein
the power conversion device case stores the cooler and is thermally connected to the cooler.

9. The power conversion device according to claim 8, wherein
the capacitor case is thermally connected to the cooler.

10. The power conversion device according to claim 1, wherein
the capacitor case and the power conversion device case are thermally connected to each other via a heat dissipation material.

* * * * *